United States Patent
Tseng et al.

(10) Patent No.: US 7,825,729 B2
(45) Date of Patent: Nov. 2, 2010

(54) CLASS AB RAIL-TO-RAIL OPERATIONAL AMPLIFIER

(75) Inventors: Kuan-Jen Tseng, Sinshih Township, Tainan County (TW); Ching-Wei Hsueh, Sinshih Township, Tainan County (TW)

(73) Assignee: Himax Analogic, Inc., Sinshih Township, Tainan County (TW)

( * ) Notice: Subject to any disclaimer, the term of this patent is extended or adjusted under 35 U.S.C. 154(b) by 59 days.

(21) Appl. No.: 12/392,259

(22) Filed: Feb. 25, 2009

(65) Prior Publication Data

US 2010/0214021 A1    Aug. 26, 2010

(51) Int. Cl.
    *H03F 3/45* (2006.01)
(52) U.S. Cl. .................. 330/255; 330/259
(58) Field of Classification Search ............. 330/253, 330/255, 259, 260, 262, 269–271
See application file for complete search history.

(56) References Cited

U.S. PATENT DOCUMENTS 6,066,985 A * 5/2000 Xu .................... 330/253
6,420,931 B1 * 7/2002 Maida ................ 330/255

* cited by examiner

*Primary Examiner*—Khanh V Nguyen
(74) *Attorney, Agent, or Firm*—Thomas, Kayden, Horstemeyer & Risley, LLP

(57) ABSTRACT

An operational amplifier includes an output unit, a voltage drop element and a feedback unit. The output unit is provided for sourcing an output current to an output of the operational amplifier when operating with a power unit for providing a current being multiple times the value of the output current. The voltage drop is provided for generating a voltage drop in accordance with the output current. The feedback unit is controlled with the voltage drop generated by the voltage drop element and controls the output unit and the power unit to regulate the output current in accordance with the voltage drop.

16 Claims, 2 Drawing Sheets

CLASS AB RAIL-TO-RAIL OPERATIONAL AMPLIFIER

BACKGROUND

1. Field of Invention

The present invention relates to an operational amplifier. More particularly, the present invention relates to a class AB rail-to-rail operational amplifier.

2. Description of Related Art

For a conventional class AB rail-to-rail operational amplifier (OP), it can be employed to deliver to and pull from a load a current that is larger than the DC quiescent current flowing into the circuit. For example, the drive current outputted from the class AB OP may be 100 milliamps and the quiescent current could be 1 milliamp. However, without limiting the drive current, the drive current could be too large and thus cause the output stage to damage.

SUMMARY

In accordance with one embodiment of the present invention, an operational amplifier is provided. The operational amplifier includes an output unit, a voltage drop element and a feedback unit. The output unit is provided for sourcing an output current to an output of the operational amplifier when operating with a power unit for providing a current being multiple times the value of the output current. The voltage drop is provided for generating a voltage drop in accordance with the output current. The feedback unit is controlled with the voltage drop generated by the voltage drop element and controls the output unit and the power unit to regulate the output current in accordance with the voltage drop.

In accordance with another embodiment of the present invention, an operational amplifier is provided. The operational amplifier includes an output transistor, a voltage drop element and a feedback transistor. The voltage drop element has a first end and a second end, in which the first end is coupled to a power voltage. The output transistor is coupled to the second end of the voltage drop element and an output of the operational amplifier and is coupled in parallel to a power transistor for providing a regulated current in accordance with at least one input signal received by the operational amplifier. The output transistor sources an output current to an output of the operational amplifier when the power transistor provides the regulated current, in which the regulated current provided by the power transistor is multiple times the value of the output current sourced by the output transistor. The feedback transistor has a first control terminal coupled to the second end of the voltage drop element, a first terminal coupled to the power voltage and a second terminal coupled to control terminals of the output transistor and the power transistor.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference to the accompanying drawings as follows.

DESCRIPTION OF THE EMBODIMENTS

In the following detailed description, the embodiments of the present invention have been shown and described. As will be realized, the invention is capable of modification in various respects, all without departing from the invention. Accordingly, the drawings and description are to be regarded as illustrative in nature, and not restrictive.

Figure 1:
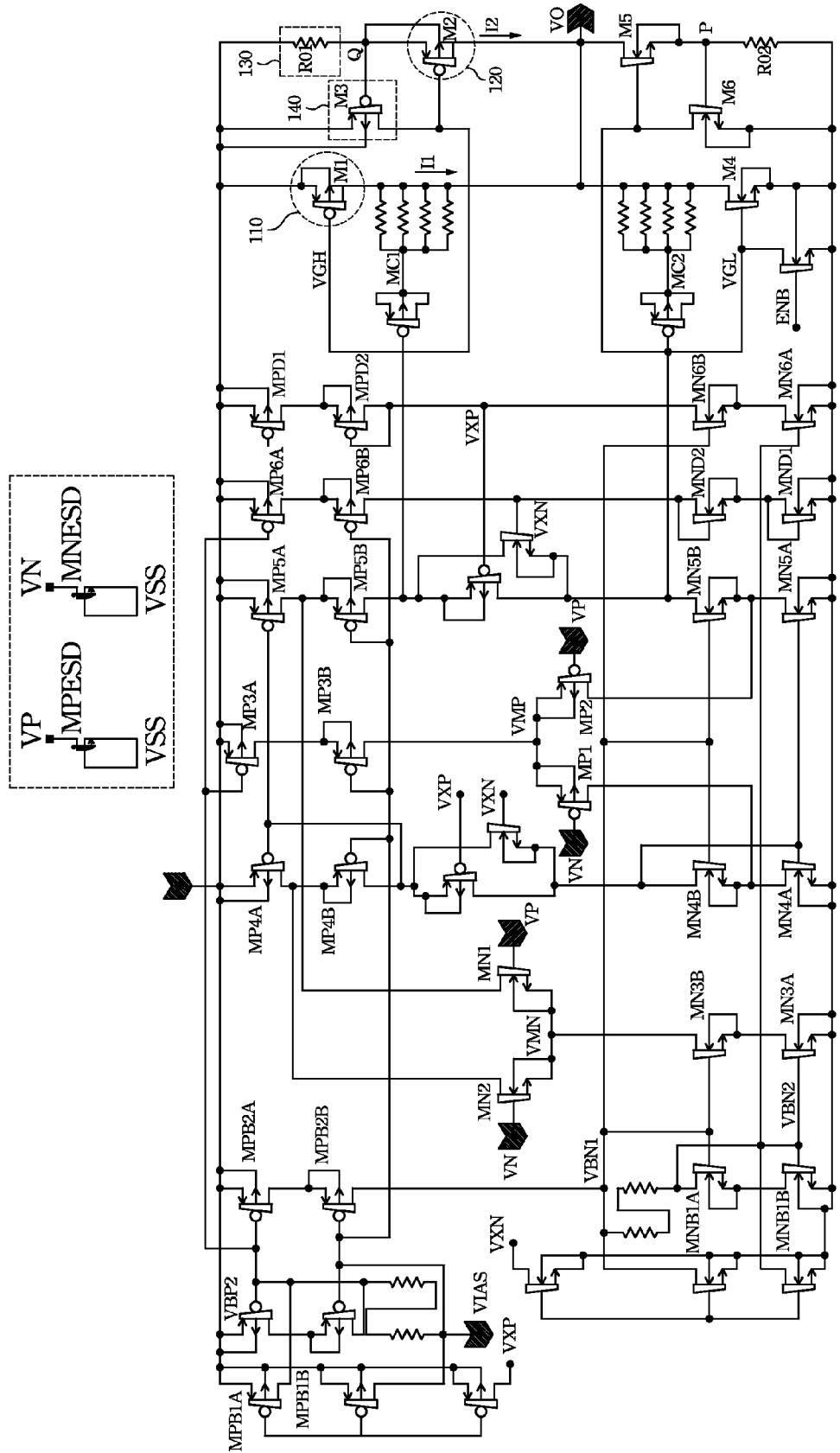
FIG. 1 and FIG. 2 illustrate a circuit diagram of a class AB rail-to-rail operational amplifier (OP).
Figure 2:
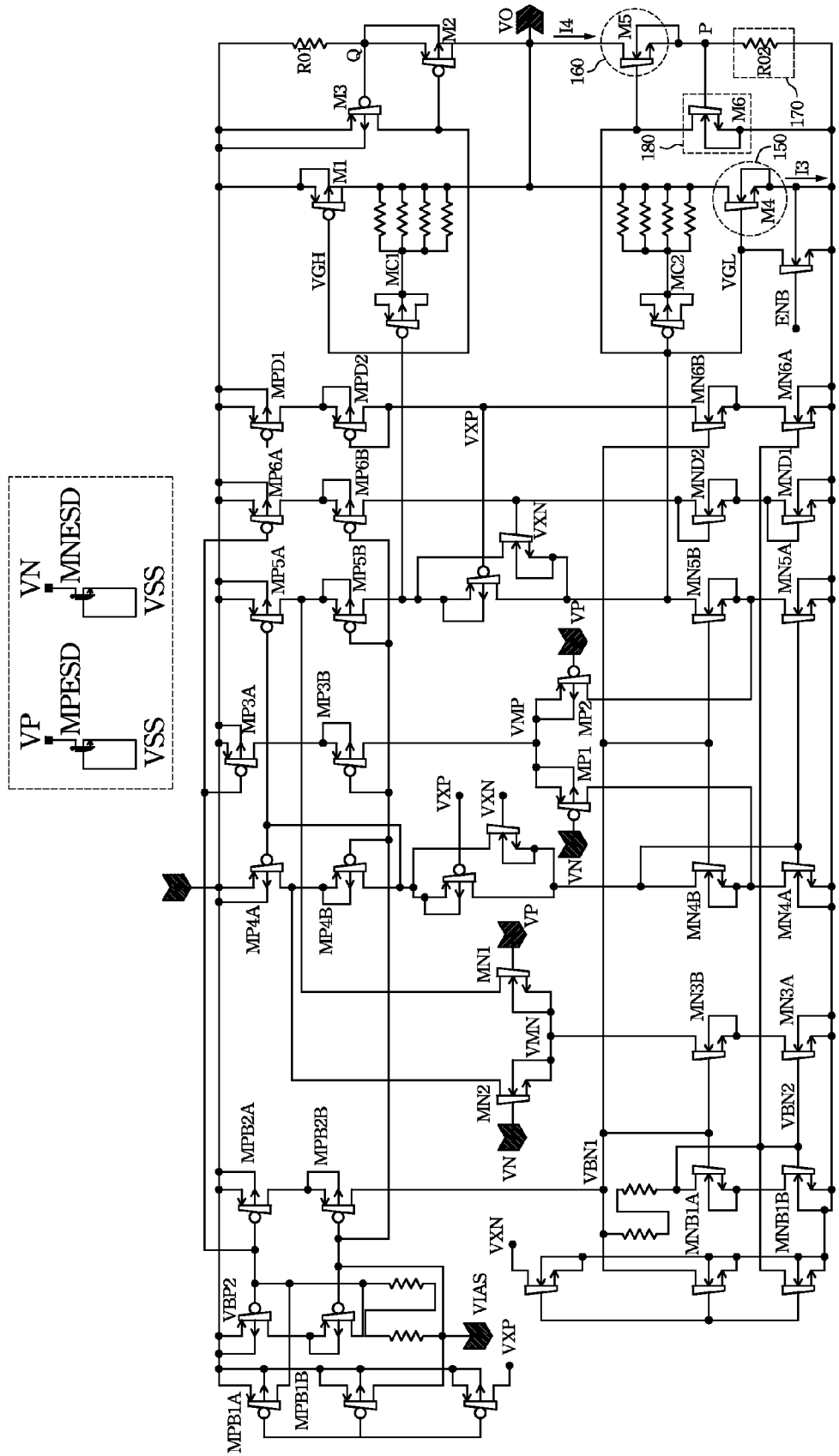

FIG. 1 and FIG. 2 illustrate a circuit diagram of a class AB rail-to-rail operational amplifier (OP). Referring to FIG. 1, the operational amplifier 100 has an output stage including a power unit 110, an output unit 120, a voltage drop element 130 and a feedback unit 140. The power unit 110 provides a regulated current I1 in accordance with input signals VP and VN received by the operational amplifier 100. The output unit 120 sources an output current I2 to the output VO of the operational amplifier 100 when operating with the power unit 110. In the present embodiment, the current I1 is multiple times the value of the output current I2. The voltage drop element 130 generates a voltage drop in accordance with the output current I2. The feedback unit 140 is controlled with the voltage drop generated by the voltage drop element 130 and then controlling the output unit 120 and the power unit 110 to regulate the output current I2 in accordance with the voltage drop.

In one embodiment, the voltage drop element 130 has a first end and a second end, in which the first end is coupled to a power voltage VDD, the power unit 110 further includes a power transistor, the output unit 120 further includes an output transistor, and the feedback unit 140 further includes a feedback transistor. The output transistor is coupled to the second end of the voltage drop element 130 and the output VO and coupled in parallel to the power transistor for providing the current I1. The feedback transistor has a control terminal coupled to the second end of the voltage drop element 130, a first terminal coupled to the power voltage VDD and a second terminal coupled to the control terminals of the output transistor and the power transistor.

As shown in FIG. 1, the power transistor can be a PMOS transistor M1, the output transistor can be a PMOS transistor M2, the voltage drop element 130 can be a resistor RO1, and the feedback transistor can be a PMOS transistor M3. In one embodiment, the transistor M1 is multiple times the size of the transistor M2 or made of multiple of the transistors M2 connected in parallel, so the current I1 is multiple times the value of the output current I2. The resistor RO1 has an end coupled to the power voltage VDD and the other end coupled to the gate of the transistor M3. The source of the transistor M3 is coupled to the power voltage VDD, and the drain of the transistor M3 is coupled to the gates of the transistors M1 and M2. The source of the transistor M2 is coupled to the gate of the transistor M3, and the drain of the transistor M2 is coupled to the output VO.

In operation, the transistor M1 provides the current I1 and the transistor M2 correspondingly sources the output current I2 when the operational amplifier 100 receives the input signals VP and VN. When the output current I2 increases to a certain value, the voltage of the node Q decreases to a certain level due to the voltage drop generated by the resistor RO1, such that the source-gate voltage (Vsg) of the transistor M3 increases and the drain voltage of the transistor M3 is changed accordingly, thus changing the gate voltages of the transistors M1 and M2. Since the gate voltages of the transistors M1 and M2 are changed, the current I1 provided by the transistor M1 and the current I2 sourced by the transistor M2 can be correspondingly regulated or limited.

Moreover, referring to FIG. 2, the output stage of the operational amplifier 100 further includes a second power unit 150, a second output unit 160, a second voltage drop element 170 and a second feedback unit 180. The second power unit 150 provides a regulated current I3 in accordance with input signals VP and VN received by the operational amplifier 100. The second output unit 160 sinks an second output current I4 from the output VO of the operational amplifier 100 when operating with the second power unit 150. In the present embodiment, the current I3 is multiple times the value of the second output current I4. The second voltage drop element 170 generates a second voltage drop in accordance with the second output current I4. The second feedback unit 180 is controlled with the second voltage drop generated by the second voltage drop element 170 and then controlling the second output unit 160 and the second power unit 150 to regulate the second output current I4 in accordance with the second voltage drop.

In one embodiment, the second voltage drop element 170 has a third end and a fourth end, in which the third end is coupled to a power voltage VSS, the second power unit 150 further includes a second power transistor, the second output unit 160 further includes a second output transistor, and the second feedback unit 180 further includes a second feedback transistor. The second output transistor is coupled to the fourth end of the second voltage drop element 170 and the output VO and coupled in parallel to the second power transistor for providing the current I3. The second feedback transistor has a control terminal coupled to the fourth end of the second voltage drop element 170, a third terminal coupled to the power voltage VSS and a fourth terminal coupled to the control terminals of the second output transistor and the second power transistor.

As shown in FIG. 2, the second power transistor can be an NMOS transistor M4, the second output transistor can be an NMOS transistor M5, the second voltage drop element 170 can be a resistor RO2, and the second feedback transistor can be an PNMOS transistor M6. In one embodiment, the transistor M4 is multiple times the size of the transistor M5 or made of multiple of the transistors M5 connected in parallel, so the current I3 is multiple times the value of the output current I4. The resistor RO2 has an end coupled to the power voltage VSS and the other end coupled to the gate of the transistor M6. The source of the transistor M6 is coupled to the power voltage VSS, and the drain of the transistor M6 is coupled to the gates of the transistors M4 and M5. The source of the transistor M5 is coupled to the gate of the transistor M6, and the drain of the transistor M5 is coupled to the output VO.

In operation, the transistor M4 provides the current I3 and the transistor M5 correspondingly sinks the output current I4 when the operational amplifier 100 receives the input signals VP and VN. When the output current I4 increases to a certain value, the voltage of the node P increases to a certain level due to the voltage drop generated by the resistor RO2, such that the gate-source voltage (Vgs) of the transistor M6 increases and the drain voltage of the transistor M6 is changed accordingly, thus changing the gate voltages of the transistors M4 and M5. Since the gate voltages of the transistors M4 and M5 are changed, the current I3 provided by the transistor M4 and the current I4 sourced by the transistor M5 can be correspondingly regulated or limited.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded with the broadest interpretation so as to encompass all such modifications and similar structures.

What is claimed is:

1. An operational amplifier, comprising:
    an output unit for sourcing an output current to an output of the operational amplifier when operating with a power unit for providing a current being multiple times the value of the output current;
    a voltage drop element for generating a voltage drop in accordance with the output current; and
    a feedback unit controlled with the voltage drop generated by the voltage drop element and controlling the output unit and the power unit to regulate the output current in accordance with the voltage drop.

2. The operational amplifier as claimed in claim 1, wherein the feedback unit further comprises a first PMOS transistor having a gate controlled with the voltage drop.

3. The operational amplifier as claimed in claim 2, wherein the first PMOS transistor has a drain voltage for controlling the output unit and the power unit when the gate of the first PMOS transistor is controlled with the voltage drop.

4. The operational amplifier as claimed in claim 3, wherein the output unit further comprises a second PMOS transistor having a gate controlled with the drain voltage of the first PMOS transistor.

5. The operational amplifier as claimed in claim 1, further comprising:
    a second output unit for sinking a second output current from the output of the operational amplifier when operating with a second power unit for providing a current being multiple times the value of the second output current;
    a second voltage drop element for generating a second voltage drop in accordance with the second output current; and
    a second feedback unit controlled with the second voltage drop generated by the second voltage drop element and controlling the second output unit and the second power unit to regulate the second output current in accordance with the second voltage drop.

6. The operational amplifier as claimed in claim 5, wherein the second feedback unit further comprises a first NMOS transistor having a gate controlled with the second voltage drop.

7. The operational amplifier as claimed in claim 6, wherein the first NMOS transistor has a drain voltage for controlling the second output unit and the second power unit when the gate of the first NMOS transistor is controlled with the second voltage drop.

8. The operational amplifier as claimed in claim 7, wherein the second output unit further comprises a second NMOS transistor having a gate controlled with the drain voltage of the first NMOS transistor.

9. An operational amplifier, comprising:
    a voltage drop element having a first end and a second end, the first end coupled to a power voltage;
    an output transistor coupled to the second end of the voltage drop element and an output of the operational amplifier and coupled in parallel to a power transistor for providing a regulated current in accordance with at least one input signal received by the operational amplifier, the output transistor sourcing an output current to the output of the operational amplifier when the power transistor providing the regulated current, the regulated current provided by the power transistor being multiple times the value of the output current sourced by the output transistor; and a feedback transistor having a first control terminal coupled to the second end of the voltage drop element, a first terminal coupled to the power voltage and a second terminal coupled to control terminals of the output transistor and the power transistor.

10. The operational amplifier as claimed in claim 9, wherein the feedback transistor is a first PMOS transistor having a gate coupled to the second end of the voltage drop element, a source coupled to the power voltage, and a drain coupled to the control terminals of the output transistor and the power transistor.

11. The operational amplifier as claimed in claim 10, wherein the output transistor is a second PMOS transistor having a gate coupled to the drain of the first PMOS transistor, a source coupled to the second end of the voltage drop element, and a drain coupled to the output of the operational amplifier.

12. The operational amplifier as claimed in claim 11, wherein the power transistor is a third PMOS transistor having a gate coupled to the drain of the first PMOS transistor and a source coupled to the power voltage.

13. The operational amplifier as claimed in claim 9, further comprising:
  - a second voltage drop element having a third end and a fourth end, the third end coupled to a second power voltage;
  - a second output transistor coupled to the fourth end of the second voltage drop element and the output of the operational amplifier and coupled in parallel to a second power transistor for providing a second regulated current in accordance with the input signal received by the operational amplifier, the second output transistor sinking a second output current from the output of the operational amplifier when the second power transistor providing the second regulated current, the regulated current provided by the power transistor being multiple times the value of the second output current sunk by the second output transistor; and
  - a second feedback transistor having a second control terminal coupled to the fourth end of the second voltage drop element, a third terminal coupled to the second power voltage and a fourth terminal coupled to control terminals of the second output transistor and the second power transistor.

14. The operational amplifier as claimed in claim 13, wherein the second feedback transistor is a first NMOS transistor having a gate coupled to the fourth end of the second voltage drop element, a source coupled to the second power voltage, and a drain coupled to the control terminals of the second output transistor and the second power transistor.

15. The operational amplifier as claimed in claim 14, wherein the second output transistor is a second NMOS transistor having a gate coupled to the drain of the first NMOS transistor, a source coupled to the fourth end of the second voltage drop element, and a drain coupled to the output of the operational amplifier.

16. The operational amplifier as claimed in claim 15, wherein the second power transistor is a third NMOS transistor having a gate coupled to the drain of the first NMOS transistor and a source coupled to the second power voltage.

* * * * *